(12) United States Patent
Mignot et al.

(10) Patent No.: US 11,107,727 B2
(45) Date of Patent: Aug. 31, 2021

(54) DOUBLE METAL DOUBLE PATTERNING WITH VIAS EXTENDING INTO DIELECTRIC

(71) Applicant: INTERNATIONAL BUSINESS MACHINES CORPORATION, Armonk, NY (US)

(72) Inventors: Yann Mignot, Slingerlands, NY (US); Hsueh-Chung Chen, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 16/408,783

(22) Filed: May 10, 2019

(65) Prior Publication Data

US 2020/0357686 A1    Nov. 12, 2020

(51) Int. Cl.
| | |
|---|---|
| *H01L 21/768* | (2006.01) |
| *H01L 23/522* | (2006.01) |
| *H01L 23/532* | (2006.01) |
| *H01L 23/528* | (2006.01) |

(52) U.S. Cl.
CPC .. *H01L 21/76816* (2013.01); *H01L 21/76807* (2013.01); *H01L 21/76877* (2013.01); *H01L 23/528* (2013.01); *H01L 23/5226* (2013.01); *H01L 23/53242* (2013.01)

(58) Field of Classification Search
CPC ................................................. H01L 21/76897
See application file for complete search history.

(56) References Cited

U.S. PATENT DOCUMENTS

| | | | |
|---|---|---|---|
| 7,867,891 B2 | 1/2011 | O'Brien et al. | |
| 8,741,763 B2 | 6/2014 | Ma et al. | |
| 8,921,225 B2 | 12/2014 | Yuan et al. | |
| 9,343,356 B2 | 5/2016 | Kuo et al. | |
| 9,728,503 B2 | 8/2017 | Peng et al. | |
| 9,786,549 B2 | 10/2017 | Singh et al. | |
| 9,805,977 B1 | 10/2017 | Sukumaran et al. | |
| 9,837,354 B2 | 12/2017 | Liu et al. | |
| 9,984,919 B1 | 5/2018 | Zhang et al. | |
| 2015/0001735 A1 | 1/2015 | Mignot et al. | |
| 2015/0140812 A1 | 5/2015 | Zope et al. | |
| 2016/0314985 A1 | 10/2016 | Yang et al. | |
| 2018/0061700 A1* | 3/2018 | Sun | H01L 21/02063 |
| 2019/0006234 A1 | 1/2019 | Fox, III | |
| 2020/0105591 A1* | 4/2020 | Lin | H01L 21/76834 |
| 2020/0273746 A1* | 8/2020 | Lin | H01L 21/76805 |

* cited by examiner

*Primary Examiner* — Christopher A Johnson
(74) *Attorney, Agent, or Firm* — Tutunjian & Bitetto, P.C.; Abdy Raissinia (57) ABSTRACT

A method is presented for constructing a dual metal interconnect structure. The method includes forming a trilayer stack over a dielectric layer, forming a plurality of vias extending through the trilayer stack and into the dielectric layer, depositing a first conductive material to fill the plurality of vias, etching the first conductive material to form first conductive regions, depositing a spacer, etching the spacer to form spacer portions adjacent the first conductive regions, and depositing a second conductive material.

17 Claims, 8 Drawing Sheets

DOUBLE METAL DOUBLE PATTERNING WITH VIAS EXTENDING INTO DIELECTRIC

BACKGROUND

The present invention generally relates to fabrication methods and resulting structures for semiconductor devices, and more specifically, to methods and structures using double metal double patterning for interconnects or wires.

Back-end-of-line (BEOL) is the second portion of integrated circuit (IC) fabrication where individual circuit devices such as transistors, capacitors, resistors, etc., are interconnected with wiring on the wafer. Common metals for the wiring include copper and aluminum. BEOL generally begins when the first layer of metal is deposited on the wafer. BEOL includes contacts, insulating layers (dielectrics), metal levels, and bonding sites for chip-to-package connections. Multiple patterning has been practiced for complementary metal-oxide-semiconductor (CMOS) manufacturing. Among the practical schemes for patterning wires, self-aligned double patterning (SADP) and self-aligned quadruple patterning (SAQP) are used to form wires.

SUMMARY

In accordance with an embodiment, a method is provided for constructing a dual metal interconnect structure. The method includes forming a trilayer stack over a dielectric layer, forming a plurality of vias extending through the trilayer stack and into the dielectric layer, depositing a first conductive material to fill the plurality of vias, etching the first conductive material to form first conductive regions, depositing a spacer, etching the spacer to form spacer portions adjacent the first conductive regions, and depositing a second conductive material.

In accordance with another embodiment, a method is provided for constructing a dual damascene structure. The method includes forming a first trilayer stack over a dielectric layer, forming a plurality of first vias extending through the first trilayer stack and into the dielectric layer, depositing a first conductive material to fill the plurality of first vias, etching the first conductive material to form first conductive regions, depositing a spacer, and etching the spacer to form spacer portions adjacent the first conductive regions. The method further includes forming a second trilayer stack, forming a plurality of second vias extending through the second trilayer stack and into the dielectric layer, and depositing a second conductive material to fill the plurality of second vias.

In accordance with yet another embodiment, a dual metal interconnect structure is provided. The dual metal interconnect structure includes a plurality of first conductive regions and a plurality of second conductive regions, the plurality of first conductive regions separated from the plurality of second conductive regions by spacers. At least a first set of the plurality of first conductive regions extend into a dielectric layer.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for enabling double metal double patterning (DMDP) with trenches and vias. Double-patterning (DP) is a method for breaking up a layout so that sub-resolution configurations are separated between two distinct masks. These masks are exposed and processed sequentially to obtain the original design pattern by composing the layout features from the independent patterning steps. Double-patterning can increase the complexity of layout verification and mask data preparation, so manufacturers must be able to identify exactly which layers need double-patterning.

However, continuing to rely on 193 nm immersion lithography with multiple patterning is becoming much more difficult at 7 nm and 5 nm. The semiconductor industry has been banking on extreme ultraviolet (EUV) lithography to circumvent the problems that 193i is beginning to encounter. For example, immersion lithography needs double patterning at 16 nm/14 nm and quadruple patterning at 7 nm. Both schemes work, but they present some challenges. Extra patterning increases the cycle time and cost in both the photomask shop and in the fab. At 7 nm and/or 5 nm, the alternative is EUV, which simplifies the patterning flow. With a 13.5 nm wavelength, EUV would be able to pattern even the finest detail with a single pass at a 22 nm half-pitch. With EUV ready, chipmakers likely would use EUV to pattern some of the critical features, such as contacts and vias, at 7 nm with a single exposure. But at 5 nm, chipmakers would need EUV, plus a multiple patterning scheme.

Self-aligned double patterning and quadruple patterning use one lithography step followed by deposition and etch steps to define features. A mandrel is formed on a substrate, then material is deposited on that layer and etched to form spacers.

In the fab, the big challenge is to execute a multi-patterning scheme with precision. In self-aligned quadruple patterning (SAQP), for example, the spacer-based mandrel has three separate critical dimensions (CDs). Each mandrel must be identical in terms of CDs. If they don't match, there are unwanted pitch walking and variability issues in a device.

Embodiments in accordance with the present invention provide methods and devices for eliminating pitch walking by forming or constructing vias that extend into a dielectric layer before metal deposition. A second metal layer is subsequently deposited after spacer deposition. This results in a double metal double patterning (DMDP) technique employing trenches and/or vias. Improvement in resistance/capacitance (R/C) performance is further achieved as the trenches and/or vias are within the same dielectric layer, without the use of any transition layers.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
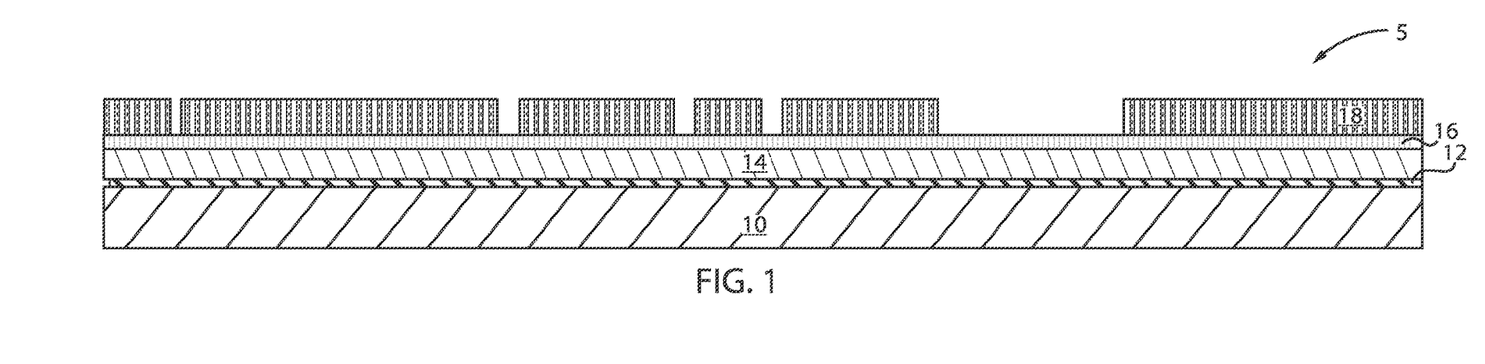
FIG. 1 is a cross-sectional view of a semiconductor structure including a dielectric layer, where an organic planarization layer (OPL), an anti-reflective coating (ARC) layer, and a photoresist are deposited over the dielectric layer, in accordance with an embodiment of the present invention.

FIG. 1 is a cross-sectional view of a semiconductor structure including a dielectric layer, where an organic planarization layer (OPL), an anti-reflective coating (ARC) layer, and a photoresist are deposited over the dielectric layer, in accordance with an embodiment of the present invention.

A semiconductor structure 5 includes a dielectric cap layer 12 formed over a dielectric layer 10. An organic planarization layer (OPL) or organic dielectric layer (ODL) 14 can then be formed over the dielectric cap layer 12. Additionally, an anti-reflective coating (ARC) layer 16 and a photoresist layer 18 can be formed over portions of the OPL 14.

The dielectric layer 10 can include any materials known in the art, such as, for example, porous silicates, carbon doped oxides, silicon dioxides, silicon nitrides, silicon oxynitrides, or other dielectric materials. The dielectric layer 10 can be formed using any method known in the art, such as, for example, chemical vapor deposition, plasma enhanced chemical vapor deposition, atomic layer deposition, or physical vapor deposition. The dielectric layer 10 can have a thickness ranging from about 25 nm to about 200 nm.

The dielectric material of layer 10 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The dielectric cap layer 12 can be referred to as a barrier layer. The dielectric material of the dielectric cap layer 12 can be, e.g., silicon nitride (SiN) or aluminum nitride (AlN).

The OPL 14 and the ARC layer 16 can be employed as a lithographic stack to pattern the underlying layers. The OPL 14 is formed at a predetermined thickness to provide reflectivity and topography control during etching of the hard mask layers below. The OPL 14 can include an organic material, such as a polymer. The thickness of the OPL 14 can be in a range from about 50 nm to about 300 nm.

The layer 16 is an ARC layer which minimizes the light reflection during lithography for a lithography stack. The ARC layer 16 can include silicon, for example, a silicon anti-reflective layer (SiARC). The thickness of the ARC layer 16 can be in range from about 10 nm to about 100 nm. The anti-reflective film layer 16 can be an antireflective layer for suppressing unintended light reflection during photolithography. Exemplary materials for an antireflective layer include, but are not limited to, metal silicon nitrides, or a polymer film. The anti-reflective layer can be formed, depending on materials, for example, using sputter deposition, chemical vapor deposition, or spin coating.

A photolithography process usually includes applying a layer of photoresist material 18 (e.g., a material that will react when exposed to light), and then selectively exposing portions of the photoresist 18 to light or other ionizing radiation (e.g., ultraviolet, electron beams, X-rays, etc.), thereby changing the solubility of portions of the material. The photoresist 18 is then developed by washing the resist with a developer solution, such as, e.g., tetramethylammonium hydroxide (TMAH), thereby removing non-irradiated (in a negative resist) or irradiated (in a positive resist) portions of the resist layer.

The OPL 14, the ARC layer 16, and the photoresist layer 18 can be referred to as a tri-layer stack.

Figure 2:
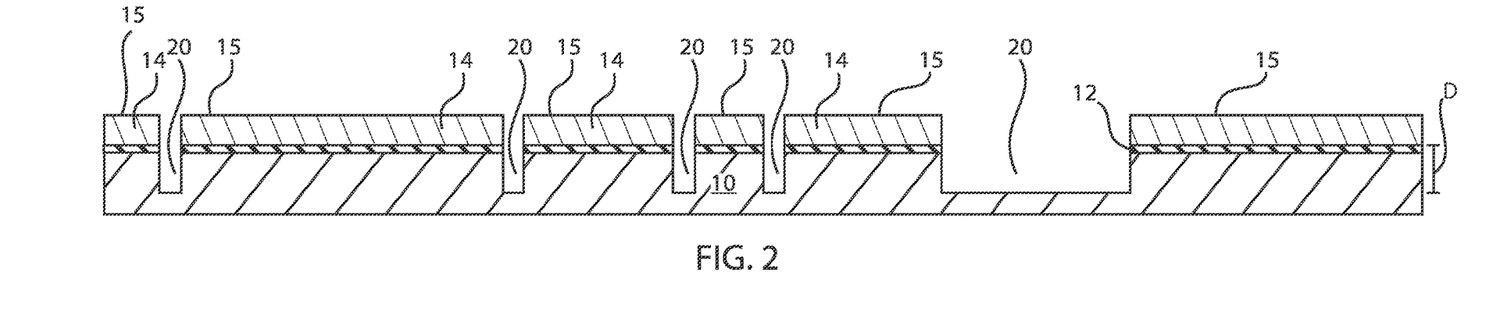
FIG. 2 is a cross-sectional view of the semiconductor structure of FIG. 1 where vias are formed that extend into the dielectric layer, in accordance with an embodiment of the present invention.

FIG. 2 is a cross-sectional view of the semiconductor structure of FIG. 1 where vias are formed that extend into the dielectric layer, in accordance with an embodiment of the present invention.

In various example embodiments, the OPL 14, the ARC layer 16, and the photoresist layer 18 are etched to form vias 20 extending into the dielectric layer 10. The vias 20 extend a distance "D" within the dielectric layer 10. A top surface 15 of the OPL 14 is exposed.

It is noted that the vias need not be the same size or depth. In one example, some vias 20 can have a first width and some vias can have a second width, where the second width is larger than the first width, and vice versa. The larger width can be more than twice the size of the smaller width. Additionally, the vias 20 can extend different distances or depths within the dielectric layer 10.

Figure 3:
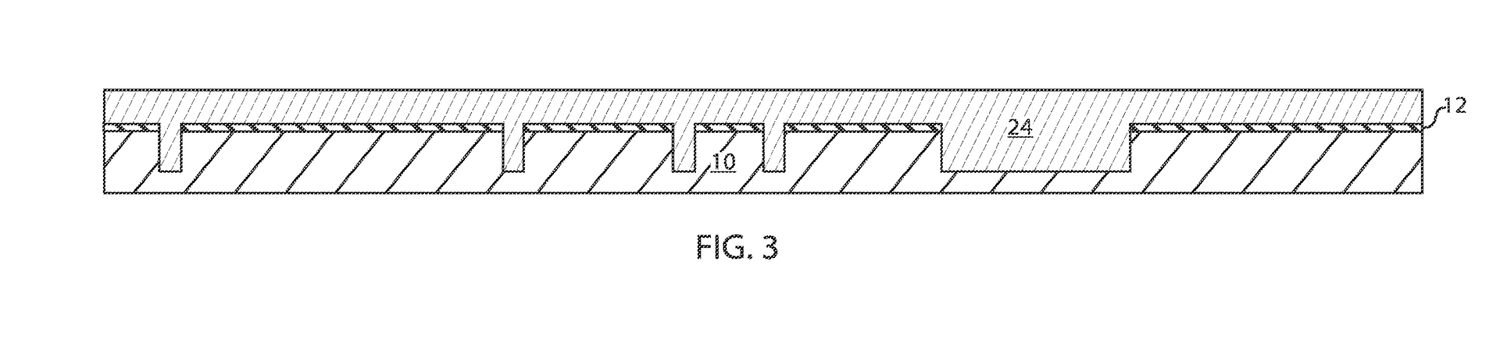
FIG. 3 is a cross-sectional view of the semiconductor structure of FIG. 2, after the OPL has been removed, where a first conductive layer is deposited in the vias of the dielectric layer and reduced by chemical-mechanical polishing (CMP), in accordance with an embodiment of the present invention.

FIG. 3 is a cross-sectional view of the semiconductor structure of FIG. 2, after the OPL 14 has been removed, where a first conductive layer is deposited in the vias of the dielectric layer and reduced by chemical-mechanical polishing (CMP), in accordance with an embodiment of the present invention.

In various example embodiments, first conductive layer 24 is deposited in the vias 20 of the dielectric layer 10 and reduced by chemical-mechanical polishing (CMP). Thus, the vias 20 are filled at the same time as metal deposition, followed by the metal etch.

The conductive material 24 can include, e.g., copper (Cu), cobalt (Co), aluminum (Al), platinum (Pt), gold (Au), tungsten (W), titanium (Ti), ruthenium (Ru) or any combination thereof. The conductive material 24 can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

In various exemplary embodiments, the height of the conductive material 24 can be reduced by chemical-mechanical polishing (CMP) and/or etching. Therefore, the planarization process can be provided by CMP. Other planarization process can include grinding and polishing.

When ruthenium is employed in FIG. 3, it is noted that ruthenium is a transition metal, which means that ruthenium has an incomplete inner shell that serves as a link between the least and the most electropositive in a series of elements. Like the other members of the platinum family (platinum, rhodium, palladium, iridium, osmium), ruthenium is inert, which means Ru will not react when exposed to most chemicals. Ruthenium is extremely hard. It is often used as a hardener for platinum and palladium. Ruthenium also will not tarnish at room temperature, and small amounts of the material can enhance the corrosion resistance of titanium. Ruthenium's hardness makes it an excellent choice for increasing the wear resistance of electrical contacts and resistors, especially when alloyed with other platinum group metals.

Ruthenium has drawn substantial interest because Ru can serve as both barrier and seed layers, minimizing the amount of high resistance material needed in semiconductor circuits. As linewidths shrink below 15 nm, though, even a 1 or 2 nanometer barrier layer can be too much. As line volume shrinks, the resistance of copper (Cu) rises sharply due to electron scattering from sidewalls and grain boundaries. Increasing resistance adds to overall circuit delays and also contributes to electromigration. As a refractory metal, ruthenium has a very high melting point (above 2300° C.) and good electromigration resistance.

Figure 4:
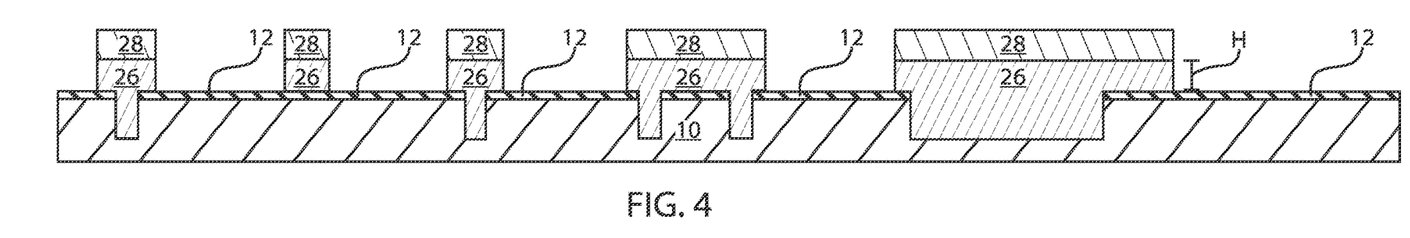
FIG. 4 is a cross-sectional view of the semiconductor structure of FIG. 3 where an organic planarization layer (OPL), an anti-reflective coating (ARC) layer, and a photoresist are deposited, and etched to form first conductive regions, in accordance with an embodiment of the present invention.

FIG. 4 is a cross-sectional view of the semiconductor structure of FIG. 3 where an organic planarization layer (OPL), an anti-reflective coating (ARC) layer, and a photoresist are deposited, and etched to form first conductive regions, in accordance with an embodiment of the present invention.

In various example embodiments, an organic planarization layer (OPL), an anti-reflective coating (ARC) layer, and a photoresist are deposited, and etched to form first conductive regions 26, as well as remaining OPL regions 28. The height "H" of the first conductive regions 26 can be, e.g., between about 30 nm and about 100 nm. The first conductive regions 26 can be irregular shaped regions or have different geometric shapes. The first conductive regions 26 can protrude into the dielectric layer 10 where the vias 20 were formed.

The etching results in the exposure of the top surface of the dielectric cap layer 12.

Main etch chemistries are dichlorine/dichloroboron ($Cl_2$/$BCl_2$) for aluminum, ruthenium, titanium and sulfur hexafluoride ($SF_6$) for tungsten, for example, and provide a good etch stop with dielectric cap layer 12.

Figure 5:
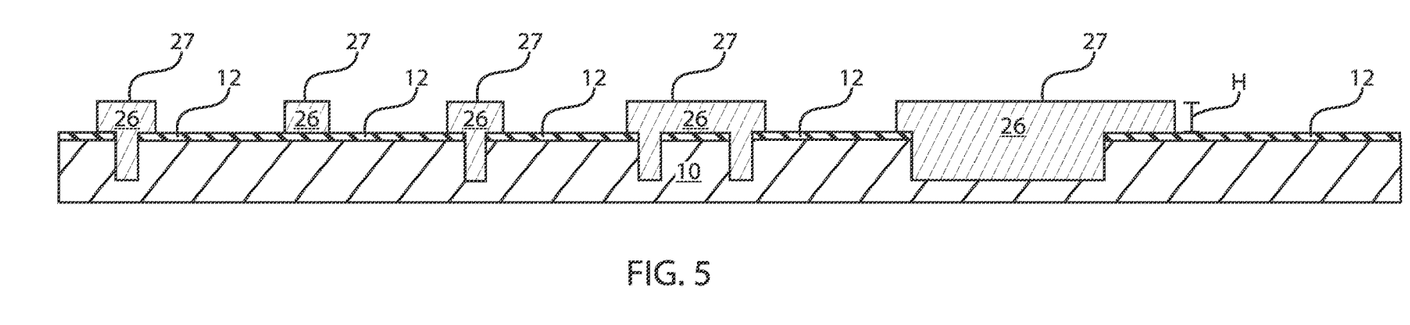
FIG. 5 is a cross-sectional view of the semiconductor structure of FIG. 4 where the remaining OPL is removed to expose a top surface of the first conductive regions, in accordance with an embodiment of the present invention.

FIG. 5 is a cross-sectional view of the semiconductor structure of FIG. 4 where the remaining OPL is removed to expose a top surface of the first conductive regions, in accordance with an embodiment of the present invention.

In various example embodiments, the remaining OPL 28 is removed to expose a top surface 27 of the first conductive regions 26. The first conductive regions 26 extend a height "H" above the top surface of the dielectric cap layer 12. The remaining OPL 28 can be removed by employing a plasma stripping process. Main etch chemistries are $N_2$/$H_2$, $CO$/$CO_2$, $O_2$/$N_2$ or any combination thereof for OPL stripping.

Figure 6:
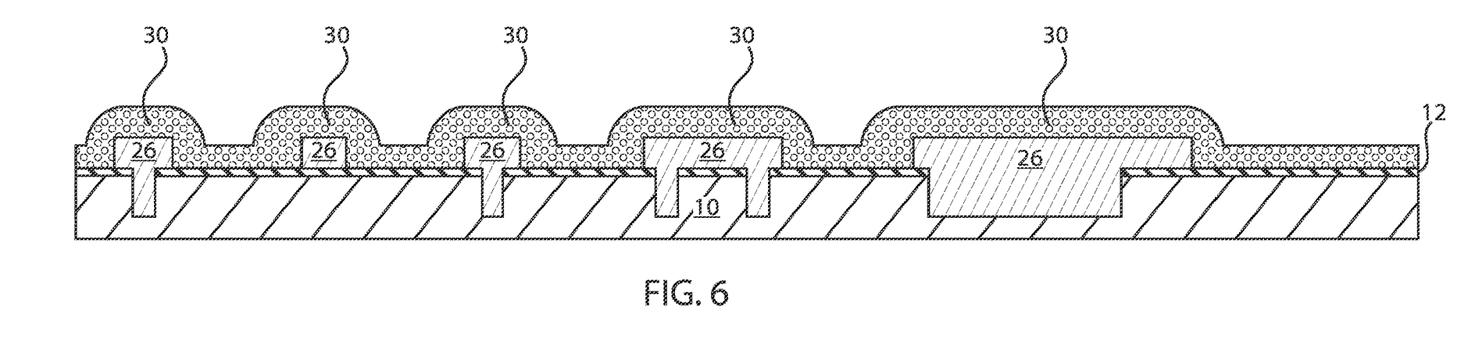
FIG. 6 is a cross-sectional view of the semiconductor structure of FIG. 5 where a spacer is deposited, in accordance with an embodiment of the present invention.

FIG. 6 is a cross-sectional view of the semiconductor structure of FIG. 5 where a spacer is deposited, in accordance with an embodiment of the present invention.

In various example embodiments, a spacer 30 is deposited. The spacer 30 can be, e.g., an oxide. The spacer 30 can be formed by, e.g., atomic layer deposition (ALD).

The spacer material 30 can include dielectric materials such as oxide materials and nitride materials. Also, example materials of the spacer material 30 can include carbon-based materials such as graphene, carbon nanotubes, and fullerenes which can be referred to as nano-carbons. Other carbon-based materials can include silicon boron carbide nitride (SiBCN), silicon oxycarbide (SiOC), silicon carbon nitride (SiCN), silicon oxygen carbon nitride (SiOCN), etc.

Figure 7:
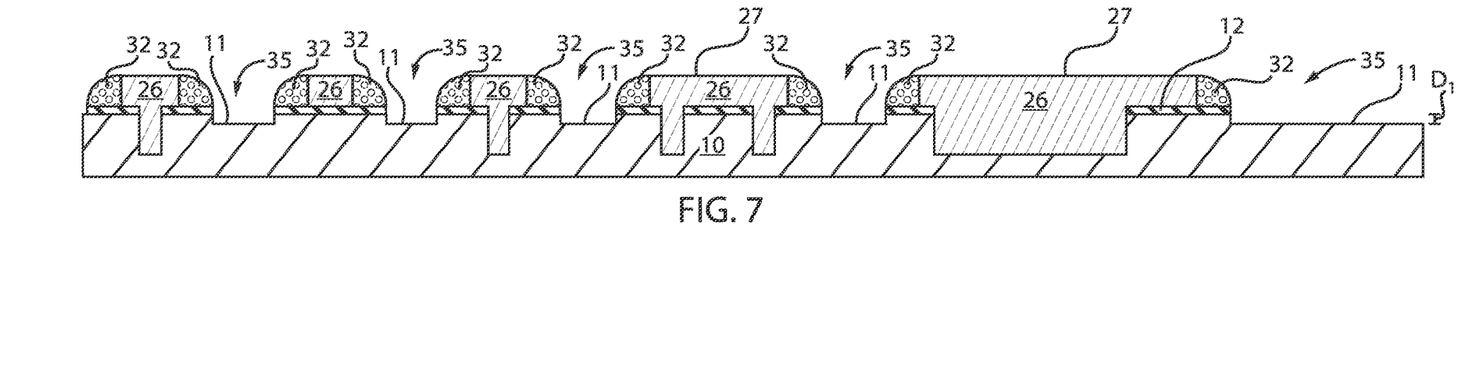
FIG. 7 is a cross-sectional view of the semiconductor structure of FIG. 6 where the spacer is etched back to form spacer regions adjacent the sidewalls of the first conductive regions, in accordance with an embodiment of the present invention.

FIG. 7 is a cross-sectional view of the semiconductor structure of FIG. 6 where the spacer is etched back to form spacer regions adjacent the sidewalls of the first conductive regions, in accordance with an embodiment of the present invention.

In various example embodiments, the spacer is etched back to form spacer regions or sections or portions 32 adjacent the sidewalls of the first conductive regions 26. The etch back is accomplished by reactive ion etching (RIE). Main etch chemistries are $CF_4$, $C_4F_8$, $CH_2F_2$ or any combination of CxHyFz for the oxide or nitride spacer with some Ar and $N_2$ to improve the etch directionality.

The etch results in the removal of portions of the dielectric cap layer 12, and a slight recess of the dielectric layer 10. The recess of the dielectric layer 10 can be designated as "D1." Thus, a top surface 11 of the dielectric layer 10 can be exposed between the first conductive regions 26. Stated differently, the first conductive regions 26 are separated by regions or areas 35. The etch further results in removal of spacer 30 over the first conductive regions 26. In other words, a top surface 27 of the first conductive regions 26 is exposed.

Figure 8:
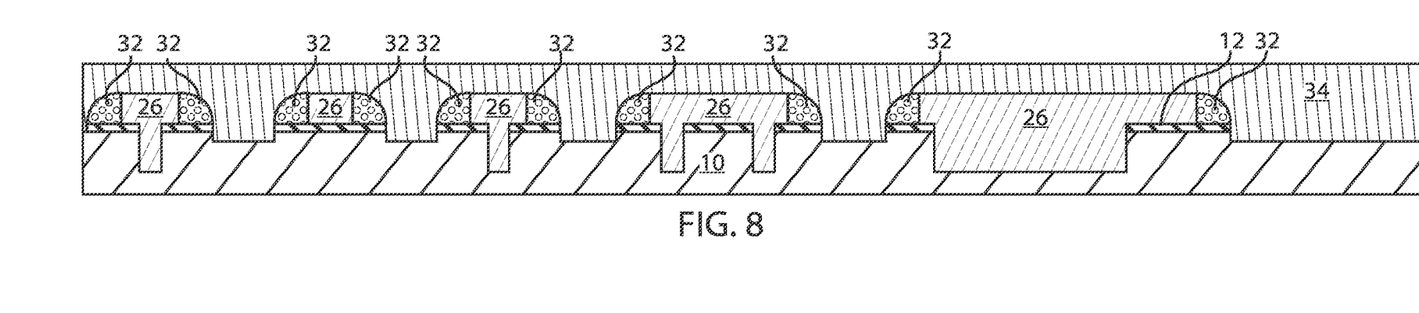
FIG. 8 is a cross-sectional view of the semiconductor structure of FIG. 7 where a second conductive layer is deposited, in accordance with an embodiment of the present invention.

FIG. 8 is a cross-sectional view of the semiconductor structure of FIG. 7 where a second conductive layer is deposited, in accordance with an embodiment of the present invention.

In various example embodiments, a second conductive layer 34 is deposited.

The conductive material 34 can include, e.g., Cu, Co, Al, Pt, Au, W, Ti, Ru or any combination thereof. The conductive material 34 can be deposited by a suitable deposition process, for example, CVD, PECVD, PVD, plating, thermal or e-beam evaporation, or sputtering.

In various exemplary embodiments, the height of the conductive material 34 can be reduced by CMP and/or etching. Therefore, the planarization process can be provided by CMP. Other planarization process can include grinding and polishing.

In some embodiments, the second conductive material 34 can be the same as the first conductive material 24. For example, both the first and second conductive materials 24, 34 can be, e.g., Ru. In other embodiments, the first conductive material 24 can be different than the second conductive material 34. For example, the first conductive material 24 can be, e.g., Ru and the second conductive material 34 can be, e.g., cobalt (Co). One skilled in the art can contemplate a plurality of different combinations for the first and second conductive materials 24, 34.

Figure 9:
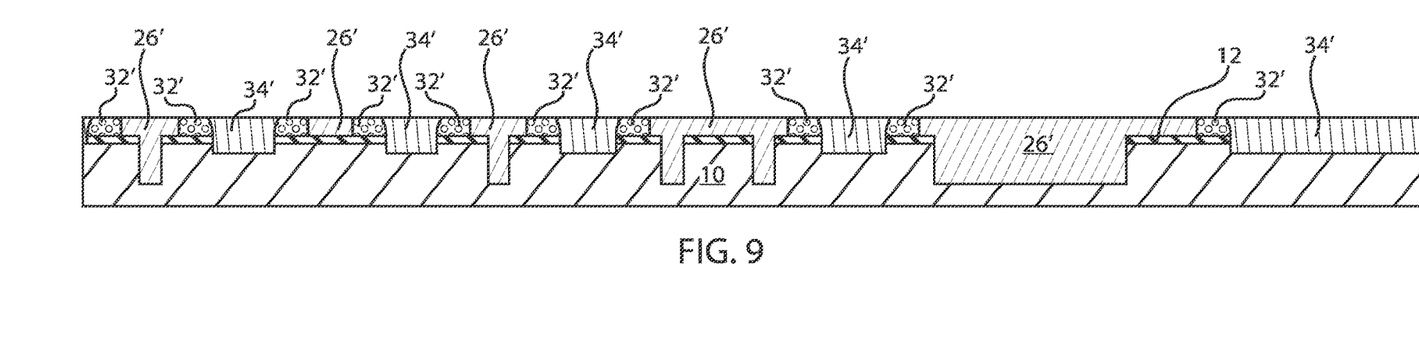
FIG. 9 is a cross-sectional view of the semiconductor structure of FIG. 8 where the second conductive layer is recessed such that recessed first conductive regions and recessed second conductive regions are formed, in accordance with an embodiment of the present invention.

FIG. 9 is a cross-sectional view of the semiconductor structure of FIG. 8 where the second conductive layer is recessed such that recessed first conductive regions and recessed second conductive regions are formed, in accordance with an embodiment of the present invention.

In various example embodiments, the second conductive material 34 is recessed such that recessed first conductive regions 26' remain. Recessed second conductive regions 34' are also present. The first and second recessed conductive regions 26', 34' are formed in an alternating manner with respect to each other over the dielectric layer 10. The recessed first conductive regions 26' still extend into the dielectric layer 10. The spacer regions 32 are recessed to spacer regions 32' and separate the recessed first conductive regions 26' from the recessed second conductive regions 34'.

In various exemplary embodiments, the height of the first and second recessed conductive regions 26', 34', as well as the recessed spacer regions 32' can be reduced by CMP and/or etching. Therefore, the planarization process can be provided by CMP. Other planarization process can include grinding and polishing.

The structure in FIG. 9 can be referred to as a dual metal interconnect structure. This structure enables an integration scheme for employing alternative metals, such as, but not limited to, Co, Ru, Ni, etc. This structure also relieves the patterning dependency on etch. In addition, the dual metals can be different. The first metal can be, e.g., Ru, and the second metal can be, e.g., Cu or Co. It is also noted that the recessed first conductive regions 26' can be geometrically different than the recessed second conductive regions 34'. In fact, the recessed first conductive regions 26' can be geometrically different with respect to each other. The recessed second conductive regions 34' can be geometrically the same with respect to each other.

Figure 10:
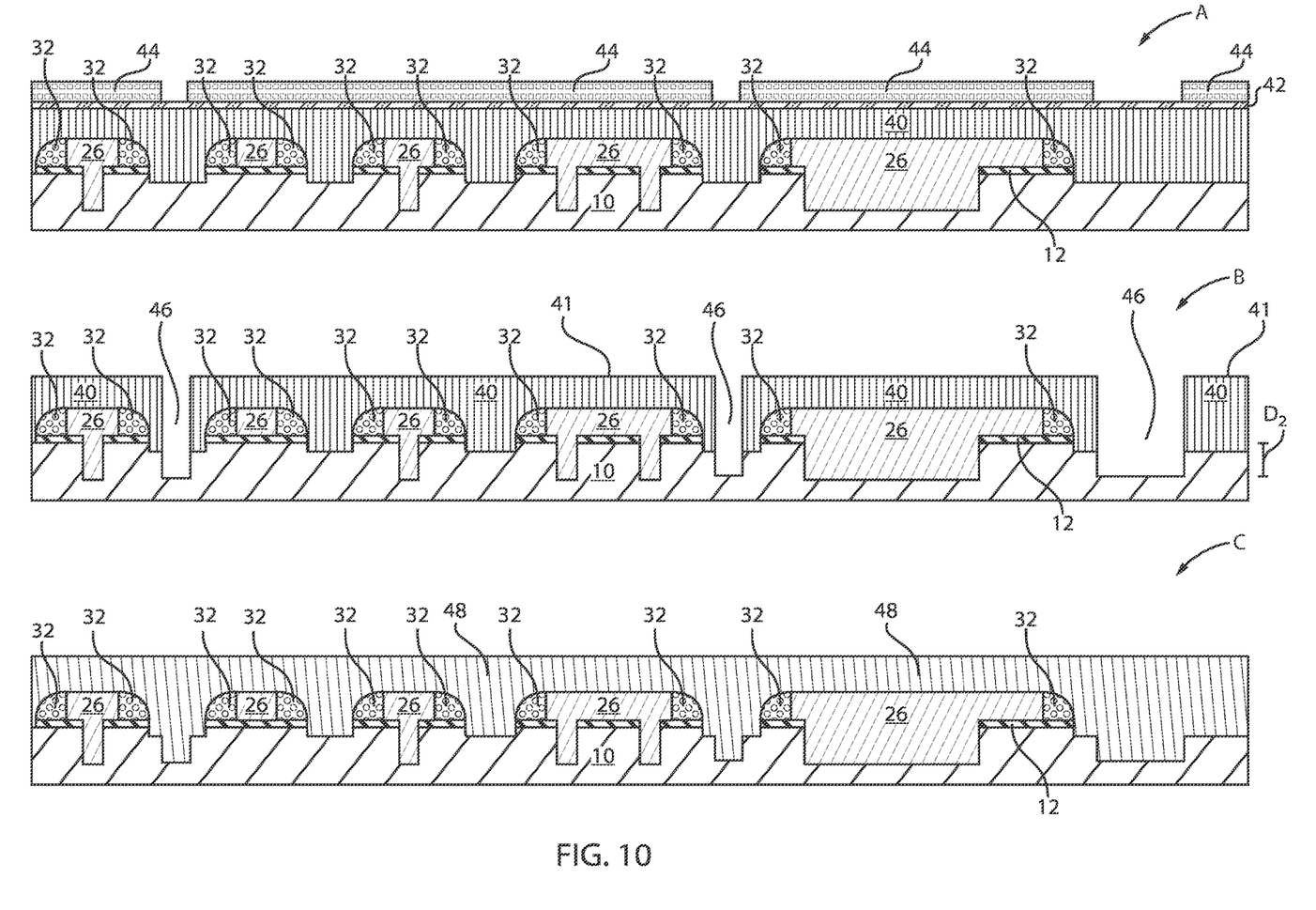
FIG. 10 is a cross-sectional view of the semiconductor structure of FIG. 7 where a tri-layer stack is formed, the tri-layer stack is etched to form vias extending into the dielectric, and a conductive layer is deposited, in accordance with another embodiment of the present invention.

FIG. 10 is a cross-sectional view of the semiconductor structure of FIG. 7 where a tri-layer stack is formed, the tri-layer stack is etched to form vias extending into the dielectric, and a conductive layer is deposited, in accordance with another embodiment of the present invention.

In various alternative example embodiments, in view A, a tri-layer stack 40, 42, 44 is formed over the structure of FIG. 7. The tri-layer stack includes an organic planarization layer (OPL) 40, an anti-reflective coating (ARC) layer, 42 and a photoresist 44, as described above.

In view B, the tri-layer stack 40, 42, 44 is etched to form vias 46 extending into the dielectric layer 10. A top surface 41 of the OPL 40 is exposed. The vias 46 extend a distance "D2" into the dielectric layer 10.

In view C, a conductive material 48 is deposited. The conductive material 48 extends into all the vias 46. The conductive material 48 can include, e.g., Cu, Co, Al, Pt, Au, W, Ti, Ru or any combination thereof. The conductive material 48 can be deposited by a suitable deposition process, e.g., CVD, PECVD, PVD, plating, thermal or e-beam evaporation, or sputtering.

It is noted that the vias need not be the same size or depth. In one example, some vias 46 can have a first width and some vias can have a second width, where the second width is larger than the first width, and vice versa. The larger width can be more than twice the size of the smaller width. Additionally, the vias 46 can extend different distances or depths within the dielectric layer 10.

Thus, FIG. 10 describes an embodiment with via for the none metal mandrel. In other words, a plurality of first vias 20 can be formed in FIG. 2 extending through the first tri-layer stack 14, 16, 18 and after further processing, a plurality of second vias 46 can be formed in FIG. 10, view B, extending through the second tri-layer stack 40, 42, 44. Thus, two different sets of vias 20, 46 can be formed to extend through the dielectric layer 10. The second conductive material 48 can directly contact the first conductive material 26. As a result, in FIGS. 1-9, only one conductive material extends into the dielectric layer 10, whereas, in FIG. 10, two conductive materials extend into the dielectric layer 10. The next process step (not shown) will be to perform a CMP as described in FIG. 9 to form a structure referred to as a dual metal interconnect structure.

Figure 11:
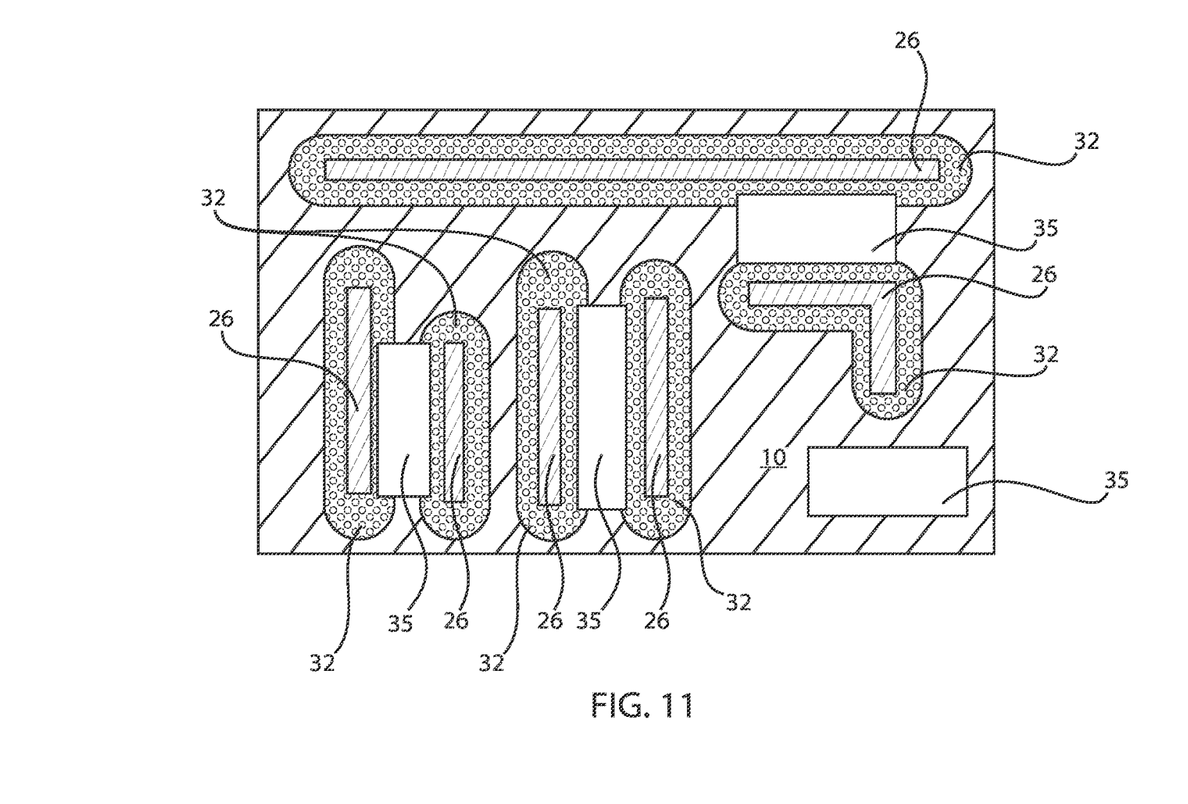
FIG. 11 is a cross-sectional view and a top view of the semiconductor structure of FIG. 7, in accordance with an embodiment of the present invention.

FIG. 11 is a cross-sectional view and a top view of the semiconductor structure of FIG. 7, in accordance with an embodiment of the present invention.

In various example embodiments, a top view of FIG. 7 illustrates the cut areas 35 for the metal fill. Additionally, the first conductive regions 26 are shown surrounded by the spacer regions 32. The cut areas 35 are depicted adjacent the spacer regions 32, between the spacer regions 32, or not touching any previous structure.

Figure 12:
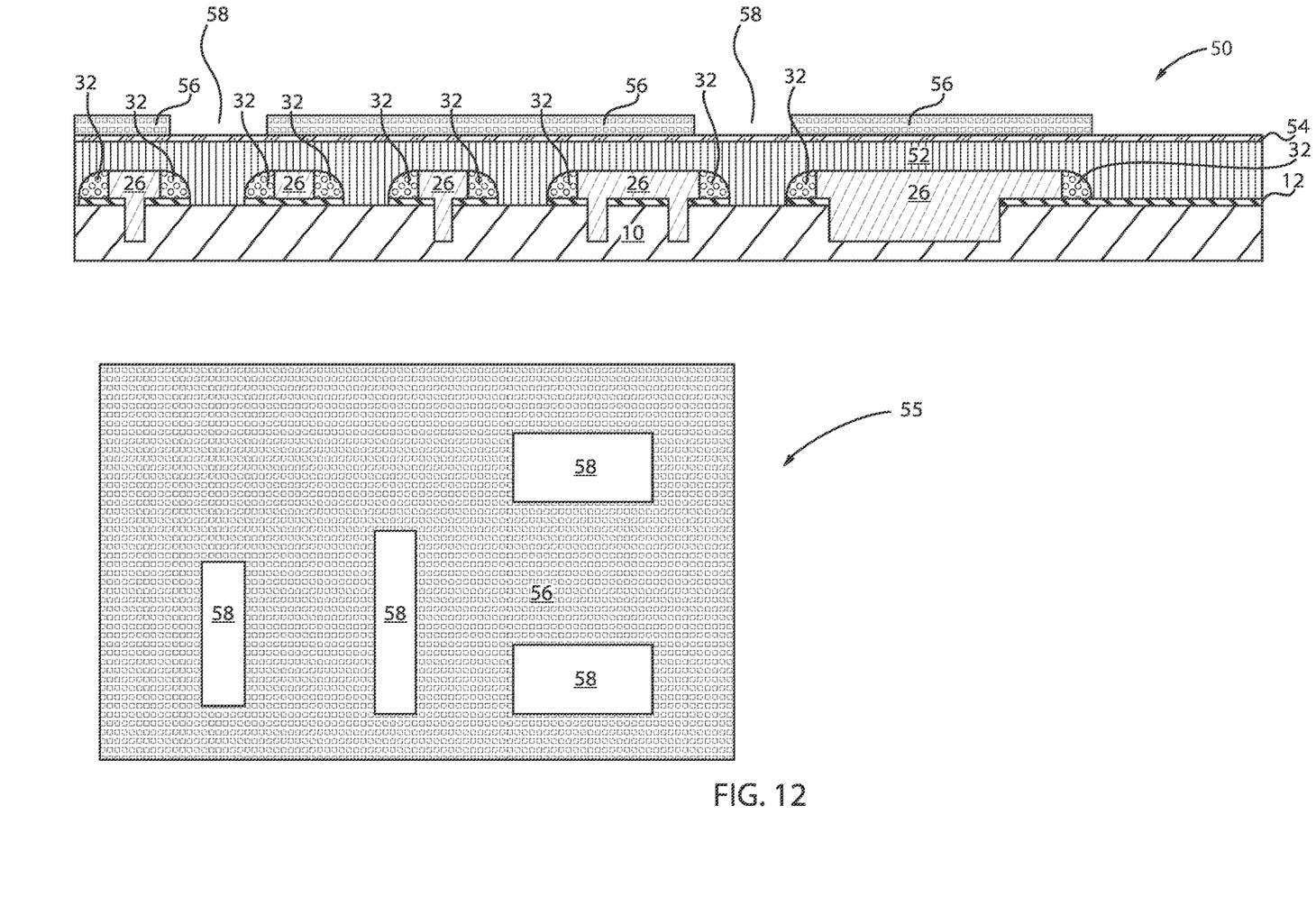
FIG. 12 is a cross-sectional view and a top view of a semiconductor structure where a block mask is deposited, in accordance with an embodiment of the present invention.

FIG. 12 is a cross-sectional view and a top view of a semiconductor structure 50 where a block mask is deposited, in accordance with an embodiment of the present invention.

In various example embodiments, instead of depositing a second conductive layer as in FIG. 8, at this stage, a block mask 52 is deposited. The block mask 52 can be an organic planarization layer (OPL). An anti-reflective coating (ARC) layer 54 and a photoresist layer 56 are then deposited over the block mask 52.

The OPL 52, the ARC layer 54, and the photoresist layer 56 can be referred to as a tri-layer stack. The top view 55 illustrates openings 58 defined by the photoresist layer 56.

Figure 13:
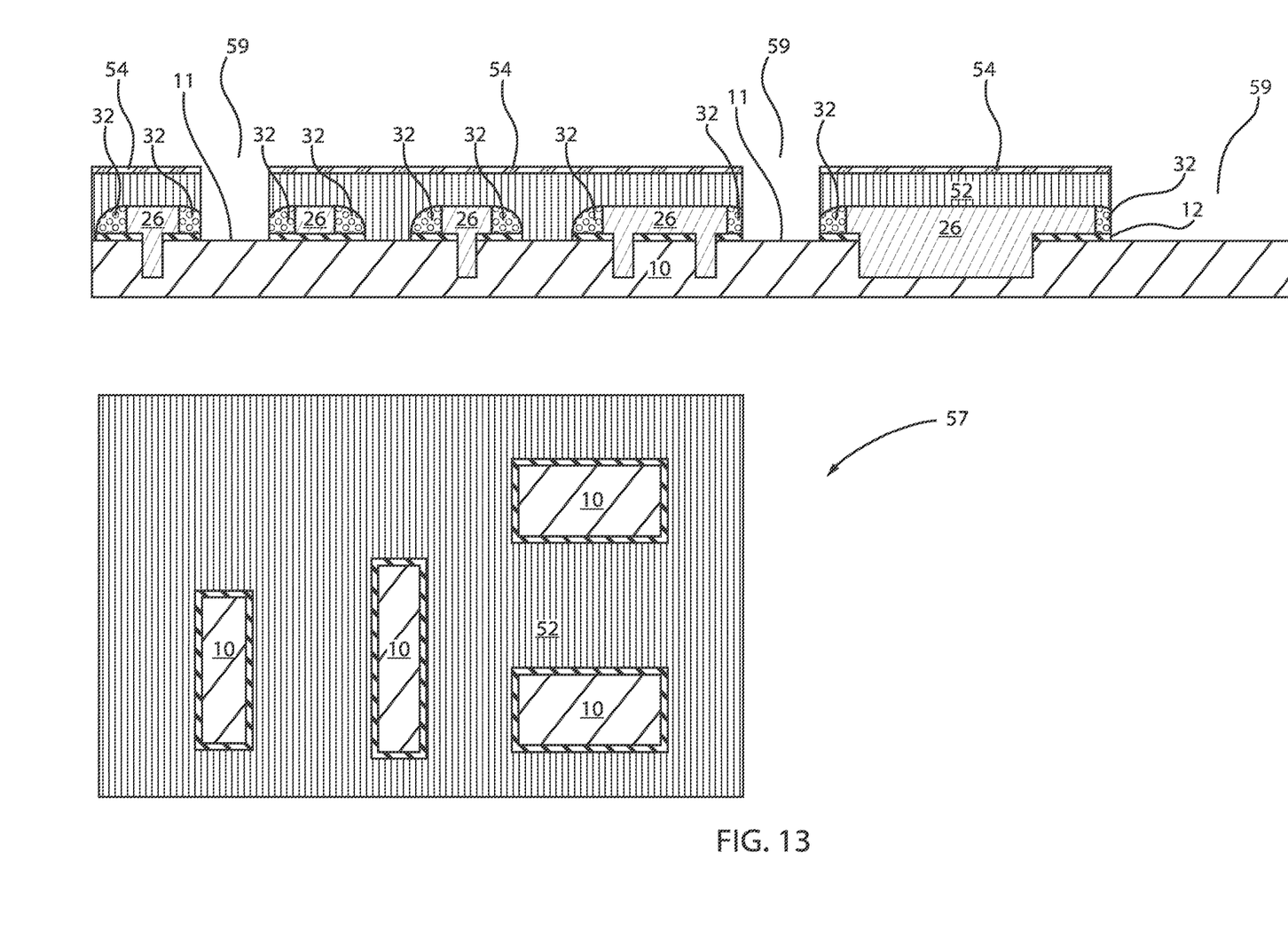
FIG. 13 is a cross-sectional view and a top view of the semiconductor structure of FIG. 12 where vias are formed extending to the dielectric layer, in accordance with an embodiment of the present invention.

FIG. 13 is a cross-sectional view and a top view of the semiconductor structure of FIG. 12 where vias are formed extending to the dielectric layer, in accordance with an embodiment of the present invention.

In various example embodiments, the tri-layer stack is etched such that a top surface 11 of the dielectric layer 10 is exposed. The openings 59 are defined by the pattern of the photoresist layer 56. The photoresist layer 56 is completely removed by the etch, whereas portions of the ARC layer 54 and the OPL 52 remain intact.

The top view 57 depicts portions or sections of the dielectric layer 10 being exposed due to the openings 59.

Figure 14:
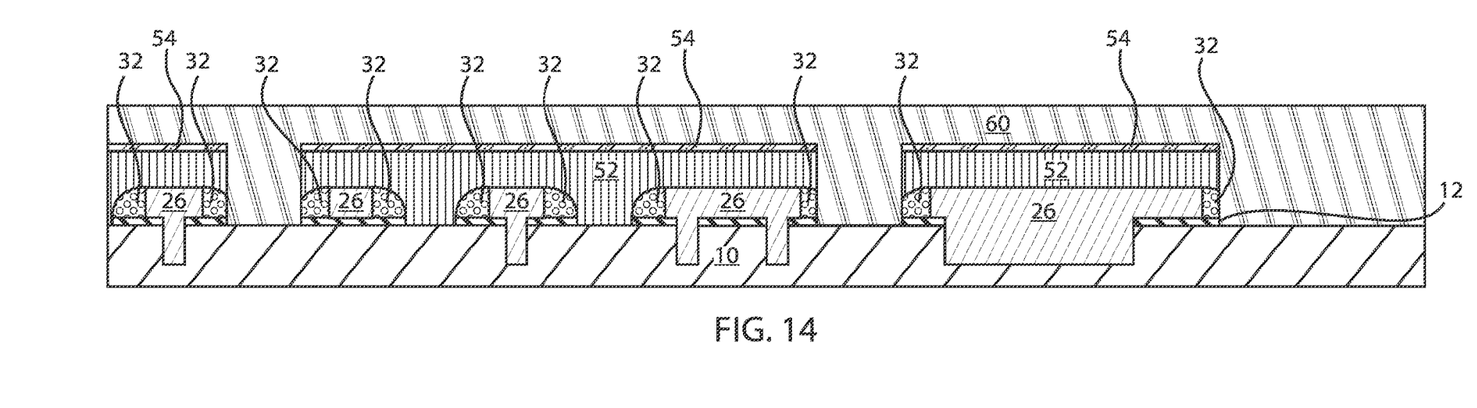
FIG. 14 is a cross-sectional view of the semiconductor structure of FIG. 13 where a second metal layer is deposited, in accordance with an embodiment of the present invention.

FIG. 14 is a cross-sectional view of the semiconductor structure of FIG. 13 where a second metal layer is deposited, in accordance with an embodiment of the present invention.

In various example embodiments, a second metal layer 60 is deposited. The metal layer 60 can include, e.g., Cu, Co, Al, Pt, Au, W, Ti, Ru or any combination thereof. The metal layer 60 can be deposited by a suitable deposition process, for example, CVD, PECVD, PVD, plating, thermal or e-beam evaporation, or sputtering.

Figure 15:
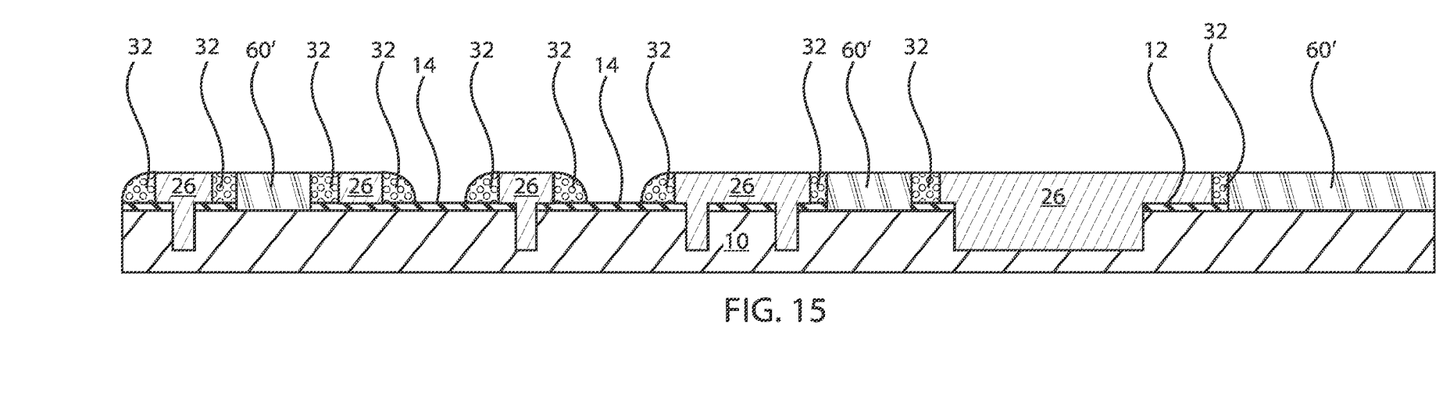
FIG. 15 is a cross-sectional view of the semiconductor structure of FIG. 14 where CMP is performed and the block mask is stripped thus forming first and second conductive regions, where the first conductive regions extend into the dielectric layer, in accordance with an embodiment of the present invention.

FIG. 15 is a cross-sectional view of the semiconductor structure of FIG. 14 where CMP is performed and the block mask is stripped thus forming first and second conductive regions, where the first conductive regions extend into the dielectric layer, in accordance with an embodiment of the present invention.

In various example embodiments, etching takes place and the remaining OPL portions are etched such that first conductive regions 26 and second conductive regions 60' are formed. The first conductive regions 26 are formed between spacer regions 32. The spacer regions 32 separate the first conductive regions 26 from the second conductive regions 60'. The first conductive regions 26 extend into the dielectric layer 10.

CMP and/or grinding can be used to planarize the first conductive regions 26 and the second conductive regions 60'.

In conclusion, BEOL interconnects are created using mostly a dual damascene scheme for copper metallization with a titanium nitride (TiN) hardmask to define the trench and via for self-aligned via (SAV) performance. The main techniques for patterning are the use of a spacer or mandrel to split the pitch, as in self-aligned double patterning (SADP) and self-aligned quadruple patterning (SAQP). However, pitch walking between mandrel and non-mandrel is an issue of conventional SADP integration schemes. Alternative metallization techniques are employed to use Metal as Mandrel (MaM) or Metal as Metal or Double Metal Double Patterning (DMDP) on a final level landing on a via. The exemplary embodiments of the present invention enable Double Metal Double Patterning (DMDP) with trenches and vias, improve resistance/capacitance (R/C) as via and/or trench into the same dielectric layer are employed without the use of any transition layers, and enable via bar like elements (1×2, →1×10, or more).

Regarding FIGS. 1-15, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for employing double metal double patterning for interconnects or wires (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for constructing a dual metal interconnect structure, the method comprising:
    forming a trilayer stack over a dielectric layer;
    forming a plurality of vias extending through the trilayer stack and into the dielectric layer;
    depositing a first conductive material to fill the plurality of vias;
    etching the first conductive material to form first conductive regions;
    depositing a spacer after formation of the first conductive regions;
    etching the spacer deposited after the formation of the first conductive regions to define spacer portions therefrom adjacent the first conductive regions; and
    depositing a second conductive material.

2. The method of claim 1, wherein a dielectric cap layer is positioned directly between the trilayer stack and the dielectric layer.

3. The method of claim 1, wherein the plurality of vias extending into the dielectric layer have different widths.

4. The method of claim 1, wherein the first and second conductive materials are the same material.

5. The method of claim 1, wherein the first conductive material is different than the second conductive material.

6. The method of claim 1, wherein the first conductive material is ruthenium (Ru).

7. The method of claim 1, further comprising etching the second conductive material to form recessed first conductive regions and recessed second conductive regions.

8. The method of claim 7, wherein the spacer portions separate the recessed first conductive regions from the recessed second conductive regions.

9. The method of claim 1, wherein the first conductive regions have different geometric shapes.

10. A method for constructing a dual damascene structure, the method comprising:
    forming a first trilayer stack over a dielectric layer;
    forming a plurality of first vias extending through the first trilayer stack and into the dielectric layer;
    depositing a first conductive material to fill the plurality of first vias;

etching the first conductive material to form first conductive regions;

depositing a spacer after formation of the first conductive regions;

etching the spacer deposited after the formation of the first conductive regions to define spacer portions therefrom adjacent the first conductive regions;

forming a second trilayer stack;

forming a plurality of second vias extending through the second trilayer stack and into the dielectric layer; and depositing a second conductive material to fill the plurality of second vias.

11. The method of claim 10, wherein the plurality of first vias extending into the dielectric layer have different widths.

12. The method of claim 10, wherein the plurality of second vias extending into the dielectric layer have different widths.

13. The method of claim 10, wherein the first and second conductive materials are the same material.

14. The method of claim 10, wherein the first conductive material is different than the second conductive material.

15. The method of claim 10, wherein the first conductive material is ruthenium (Ru).

16. The method of claim 10, wherein the first conductive regions directly contact the second conductive material.

17. The method of claim 10, wherein the first conductive regions have different geometric shapes.

* * * * *